(12) United States Patent  
Eun

(10) Patent No.: US 11,830,999 B2  
(45) Date of Patent: Nov. 28, 2023

(54) HYBRID ENERGY STORAGE MODULE SYSTEM HAVING AUXILIARY BATTERY

(71) Applicant: JSYOUNGTECH CO., LTD, Anyang-si (KR)

(72) Inventor: Keun Soo Eun, Seoul (KR)

(73) Assignee: JSYOUNGTECH CO., LTD., Anyang-si (KR)

( * ) Notice: Subject to any disclaimer, the term of this patent is extended or adjusted under 35 U.S.C. 154(b) by 546 days.

(21) Appl. No.: 17/251,616

(22) PCT Filed: Feb. 19, 2019

(86) PCT No.: PCT/KR2019/001978  
§ 371 (c)(1),  
(2) Date: Dec. 11, 2020

(87) PCT Pub. No.: WO2020/004768  
PCT Pub. Date: Jan. 2, 2020

(65) Prior Publication Data  
US 2021/0111452 A1 Apr. 15, 2021

(30) Foreign Application Priority Data  
Jun. 27, 2018 (KR) .......... 10-2018-0073832

(51) Int. Cl.  
*H01M 12/02* (2006.01)  
*G01R 31/382* (2019.01)  
(Continued)

(52) U.S. Cl.  
CPC .......... *H01M 12/02* (2013.01); *G01R 31/382* (2019.01); *H02J 1/10* (2013.01); *H02J 7/0048* (2020.01); *H02J 7/34* (2013.01); *H02J 9/061* (2013.01)

(58) Field of Classification Search  
CPC ........ H01M 12/02; G01R 31/382; H02J 1/10; H02J 7/0048; H02J 7/34; H02J 9/061  
(Continued)

(56) References Cited

U.S. PATENT DOCUMENTS

2012/0074894 A1* 3/2012 Chen .................. H02J 7/342  
320/103  
2015/0202984 A1 7/2015 Wyatt et al.  
(Continued)

FOREIGN PATENT DOCUMENTS

EP 3248827 A1 11/2017  
JP 2011-178384 A 9/2011  
(Continued)

*Primary Examiner* — Hal Kaplan  
(74) *Attorney, Agent, or Firm* — NKL Law; Jae Youn Kim

(57) ABSTRACT

A hybrid energy storage module system for supplying electric power required to drive a load includes: an energy storage device including a second battery module, a first battery module having a higher discharge rate than the second battery module and a switching network configured to connect the first battery module to the second battery module in parallel or disconnect the first battery module from the second battery module, the energy storage device connected to the load and configured to supply electric power to the load; a first detection unit configured to measure data representing a state of the first battery module; a second detection unit configured to measure data representing a state of the second battery module; and a controller configured to receive data from the first detection unit and the second detection unit, generate a control signal for controlling the switching network, and transmit the control signal to the switching network.

11 Claims, 7 Drawing Sheets

(51) Int. Cl.
*H02J 7/00* (2006.01)
*H02J 1/10* (2006.01)
*H02J 7/34* (2006.01)
*H02J 9/06* (2006.01)

(58) Field of Classification Search
USPC .......................................................... 307/64
See application file for complete search history.

(56) References Cited

U.S. PATENT DOCUMENTS

2016/0046195 A1    2/2016  Jang et al.
2017/0368958 A1*  12/2017  Eun ......................... B60L 50/60

FOREIGN PATENT DOCUMENTS

| | | |
|---|---|---|
| JP | 2012-070609 A | 4/2012 |
| JP | 2014-200123 A | 10/2014 |
| JP | 2016-067142 A | 4/2016 |
| JP | 2016-174475 A | 9/2016 |
| JP | 2017-214040 A | 12/2017 |
| KR | 10-2005-0070726 A | 7/2005 |
| KR | 10-2005-0070727 A | 7/2005 |
| KR | 10-2011-0081622 A | 7/2011 |
| KR | 10-2013-0042088 A | 4/2013 |
| KR | 10-2015-0014890 A | 2/2015 |
| KR | 10-1553063 B1 | 9/2015 |
| WO | 2013/115034 A1 | 8/2013 |

* cited by examiner

HYBRID ENERGY STORAGE MODULE SYSTEM HAVING AUXILIARY BATTERY

TECHNICAL FIELD

The present invention relates to a hybrid energy storage module system, and more particularly, to a hybrid energy storage module system capable of supplementing a main battery such as a lead battery or the like with an auxiliary battery such as a lithium battery or the like having different characteristics from the main battery, and appropriately coping with the change in the amount of electric power required by a load.

BACKGROUND ART

The energy storage system is a system that separately stores the remaining electric power and supplies it when necessary. The energy storage system may be largely classified into a physical energy storage system and a chemical energy storage system according to the storage method. Examples of the physical energy storage system include a pumped power generation system, a compressed air storage system, a flywheel and the like. Examples of the chemical energy storage system include a lithium battery, a lead battery, a NaS battery and the like.

Energy storage systems have been actively researched in that the power supply/demand problem can be solved by storing the electricity discarded at night in an energy storage system and using the stored electricity during the peak time.

An example of a small energy storage system is a battery for an electric vehicle. An electric vehicle is a vehicle driven by a motor and is equipped with a large-capacity battery. As such a battery, a lead battery has been used in the past. However, a nickel hydride battery and a lithium battery are mainly used nowadays. It is expected that the lithium battery is mainly used in the future.

The lead battery used in the past has an advantage that it is relatively inexpensive and highly reliable. However, the lead battery has problems in that the output per unit weight thereof is low, the volume thereof is large, the output voltage thereof decreases when used for a long time, and the discharge rate thereof is low, whereby the lifespan thereof is shortened due to overheating when the lead battery is frequently exposed to a load that requires a high output. Therefore, the lead battery is not preferentially selected for an electric vehicle, and the use thereof is avoided. In addition, there is another problem that the lead battery is not suitable for charging the electric energy recovered through regenerative braking.

The lithium battery is in the spotlight as a high-output and high-density battery as compared to other batteries. However, the lithium battery is very expensive, and the performance thereof is largely influenced by the temperature. In particular, electrolyte decomposition occurs at a high temperature, and the lifespan thereof is significantly reduced. There is also a risk of ignition and explosion. In order to improve such problems, Korean Patent Application Publication Nos. 2010-0001877, 2003-0100891, 2003-0100893 and the like disclose a method for cooling a battery.

The currently-used lead battery can store electric energy of about 1 kWh per 10 kg, and the electric vehicle can travel 5 to 10 km with the electric energy of about 1 kWh. Therefore, in order for the electric vehicle to travel about 700 km, a lead battery of about 1 ton is required even if the lead battery has a high density. Therefore, the low-density secondary battery such as a lead battery or the like cannot be used as a battery for an electric vehicle.

However, the electric vehicle capable of traveling about 100 km on a single charge has a short mileage. Therefore, there is no need to use a high-density battery. Rather, if a low-cost lead battery can be used, there is an advantage that the cost is reduced and the risk of ignition and explosion is removed, which makes it unnecessary to adopt a complicated structure for cooling. In addition, since it is unnecessary to consider the risk of ignition or explosion when arranging the battery, there is an advantage that the battery can be arranged more freely.

However, as described above, when the lead battery is used for a long time, the output voltage thereof is lowered, which makes it difficult for an electric vehicle to travel. The output of the lead battery is lower than that of the lithium battery. Therefore, it is difficult for the lead battery to cope with a case where a high output is required, such as a case where an electric vehicle starts after stopping or a case where an electric vehicle travel on a hill. Furthermore, there is a problem that the lifespan of lead battery is shortened when frequently exposed to a load that requires a high discharge rate. In addition, there is a problem that lead battery is difficult to use for charging electric energy generated by regenerative braking.

Furthermore, in the conventional hybrid battery system in which different types of batteries are alternately used, the amount of energy is rapidly changed according to the change in the type of battery used. This poses a problem in that a passenger or a user may feel an impact generated by the change in the amount of energy. In addition, there is a problem that the energy efficiency is also deteriorated.

Furthermore, in a plug-in hybrid vehicle equipped with a hybrid battery system, when charging needs to be performed simultaneously with traveling, a range extender is operated to charge a lithium battery. The driving of the hybrid vehicle is performed by a lead battery. This poses a problem in that a lithium battery with a larger capacity than necessary needs to be provided and charged.

PRIOR ART DOCUMENTS

Patent Documents

Patent Document 1: Korean Patent Application Publication No. 2010-0001877
Patent Document 2: Korean Patent Application Publication No. 2003-0100891
Patent Document 3: Korean Patent Application Publication No. 2003-0100893
Patent Document 4: Korean Patent Publication No. 10-1281066
Patent Document 5: Japanese Patent Application Publication No. 2010-093993

SUMMARY

An object of the present invention is to provide a hybrid energy storage module system capable of coping with the demand of high output and enjoying high reliability. For example, it is an object of the present invention to provide a highly-reliable inexpensive energy storage module system capable of traveling about 100 km with a single charge.

In order to achieve the above object, the present invention provides a hybrid energy storage module system for supplying electric power required to drive a load, comprising: an energy storage device including a second battery module, a first battery module having a higher discharge rate than the second battery module and a switching network configured to connect the first battery module to the second battery module in parallel or disconnect the first battery module from the second battery module, the energy storage device connected to the load and configured to supply electric power to the load; a first detection unit configured to measure data representing a state of the first battery module; a second detection unit configured to measure data representing a state of the second battery module; and a controller configured to receive data from the first detection unit and the second detection unit, generate a control signal for controlling the switching network, and transmit the control signal to the switching network, wherein the controller is configured to generate a control signal for controlling the switching network so that the second battery module is connected to the load before the first battery module is connected to the second battery module, the controller is configured to generate a control signal for controlling the switching network based on data received from the first detection unit and the second detection unit so that the first battery module is selectively connected to or disconnected from the second battery module, and the switching network includes at least one switch installed in a network that connects the second battery module and the first battery module in parallel with each other.

In the system, the energy storage device may further include a current limiting circuit, the switching network may be configured to selectively connect or disconnect the current limiting circuit to or from the first battery module or the second battery module, and the controller may be configured to generate a control signal for controlling the switching network based on data received from the first detection unit and the second detection unit so as to connect the first battery module or the second battery module to the current limiting circuit before connecting the second battery module to the first battery module.

In the system, the controller may be configured to generate a control signal for controlling the switching network so that the second battery module is disconnected from the load after the first battery module is disconnected from the second battery module.

In the system, the controller may be configured to generate a control signal for controlling the switching network so that the first battery module is charged after the first battery module is disconnected from the second battery module when charging is performed by regenerative braking.

In the system, the controller may be configured to generate a control signal for controlling the switching network so that the first battery module is connected to the second battery module when the magnitude and slope of a current flowing through an output terminal of the second battery module, which are received from the second detection unit, are equal to or larger than a predetermined value.

In the system, the switching network may be provided with a first diode configured to prevent a current from flowing from the first battery module to the second battery module and a second diode configured to prevent a current from flowing from the second battery module to the first battery module.

In the system, the switching network may include switches installed in a network that connects the second battery module, the first battery module and the current limiting circuit in parallel with each other.

In the system, the first battery module may be a lithium battery module.

In the system, the lithium battery module may be selected from a lithium polymer battery, a lithium manganese battery, a lithium iron battery, a lithium ion battery and a lithium air battery.

In the system, the second battery module may be a lead battery module.

In the system, the current limiting circuit may be a variable resistor.

The hybrid energy storage module system according to the present invention has an advantage that it enjoys high reliability while being able to cope with a demand for high output through an auxiliary battery such as a lithium battery module or the like.

Furthermore, the lead battery module, which is inexpensive, is used as a main battery. It is therefore possible to reduce the manufacturing cost.

Furthermore, it is possible to use an auxiliary battery having a smaller capacity than that of the existing hybrid battery system. Therefore, the cost reduction effect is large.

Furthermore, the need for a separate cooling system to prevent the temperature of the lithium battery from increasing due to the continuous use of the lithium battery is low. Therefore, the structure of the system is simple. In addition, the lead battery is quite stable. Therefore, it is only necessary to install the lithium battery at a safe location in consideration of the safety of vehicle occupants. This makes it easy to arrange the system in an electric vehicle.

DETAILED DESCRIPTION

Figure 1:
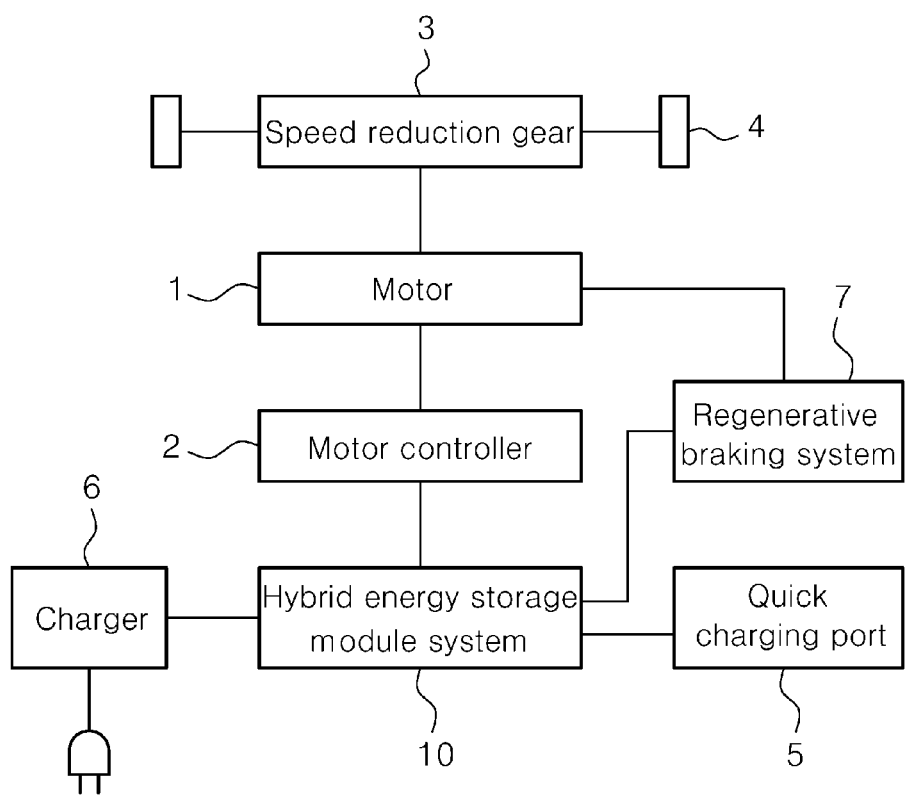
FIG. 1 is a block diagram of an electric vehicle system.

Hereinafter, preferred embodiments of the present invention will be described in detail with reference to the accompanying drawings.

The following embodiments are provided by way of example in order to sufficiently convey the spirit of the present invention to those skilled in the art. Therefore, the present invention is not limited to the embodiments described below and may be embodied in other forms. In the drawings, the width, length, thickness and the like of each component may be exaggerated for the sake of convenience. Like reference numerals indicate the same elements throughout the specification.

The hybrid energy storage module system of the present invention can be used for various purposes. Hereinafter, the case where the hybrid energy storage module system is used for an electric vehicle will be described as an example.

Electric vehicles include a hybrid vehicle (HEV), a plug-in hybrid vehicle (PHEV) and a pure electric vehicle (EV). In addition, electric vehicles include a passenger car, a van, a bus, a scooter, a motorcycle, a wheelchair, an electric forklift, a sweeper, an electric bicycle and the like. Hereinafter, the pure electric vehicle will be described as an example.

FIG. 1 is a block diagram of an electric vehicle system. Referring to FIG. 1, an electric vehicle includes a motor 1, a motor controller 2, a hybrid energy storage module system 10, a speed reduction gear 3 and a regenerative braking system 7.

The motor 1 of the electric vehicle is also called a motor generator. This is because, when a brake is applied while traveling, the motor 1 is used as a generator to charge an energy storage device such as a lithium battery module or a lead battery module of the hybrid energy storage module system 10. This is called regenerative braking. The motor 1 is connected to wheels 4 through a speed reduction gear 3.

The motor controller 2 includes a motor control unit and an inverter that converts a direct current of a battery into a 3-phase alternating current in order to drive the motor 1 in response to a command of the motor control unit. The inverter converts a direct current into an alternating current by turning a power transistor on and off.

An energy storage device 20 of the hybrid energy storage module system 10 may be charged through a quick charging port 5 used when charging at a quick charging station similar to a general gas station and a general charger 6 that can be charged through a general power source used at home. Further, the energy storage device 20 may be charged by the regenerative braking system 7.

Figure 2:
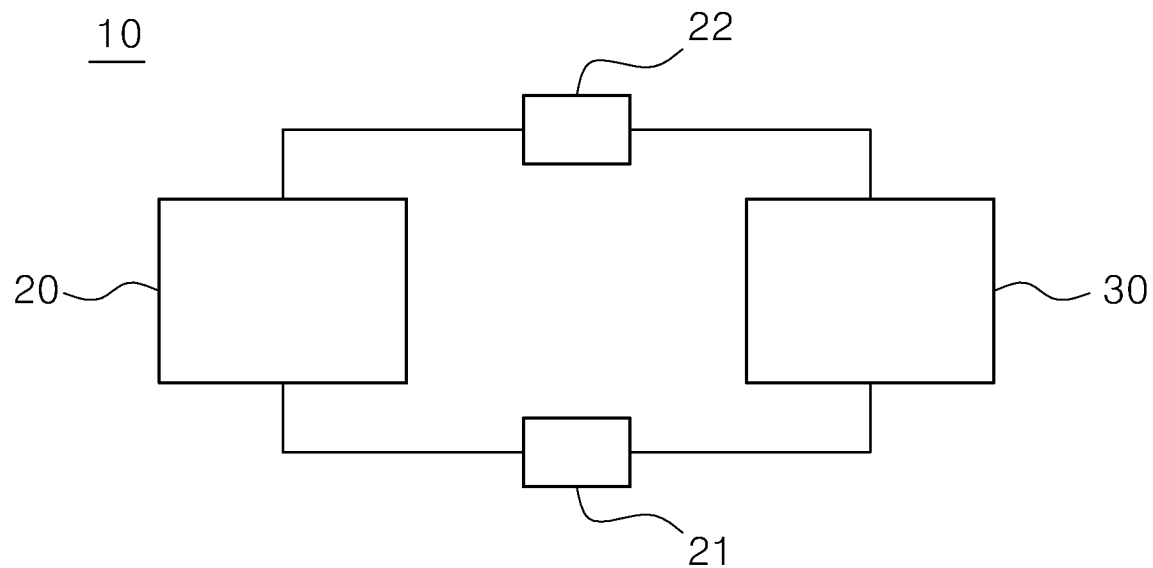
FIG. 2 is a block diagram of a hybrid energy storage module system according to an embodiment of the present invention.

FIG. 2 is a block diagram of the hybrid energy storage module system according to an embodiment of the present invention. Referring to FIG. 2, the hybrid energy storage module system 10 includes an energy storage device 20, a first detection unit 21, a second detection unit 22 and a controller 30.

Figure 3:
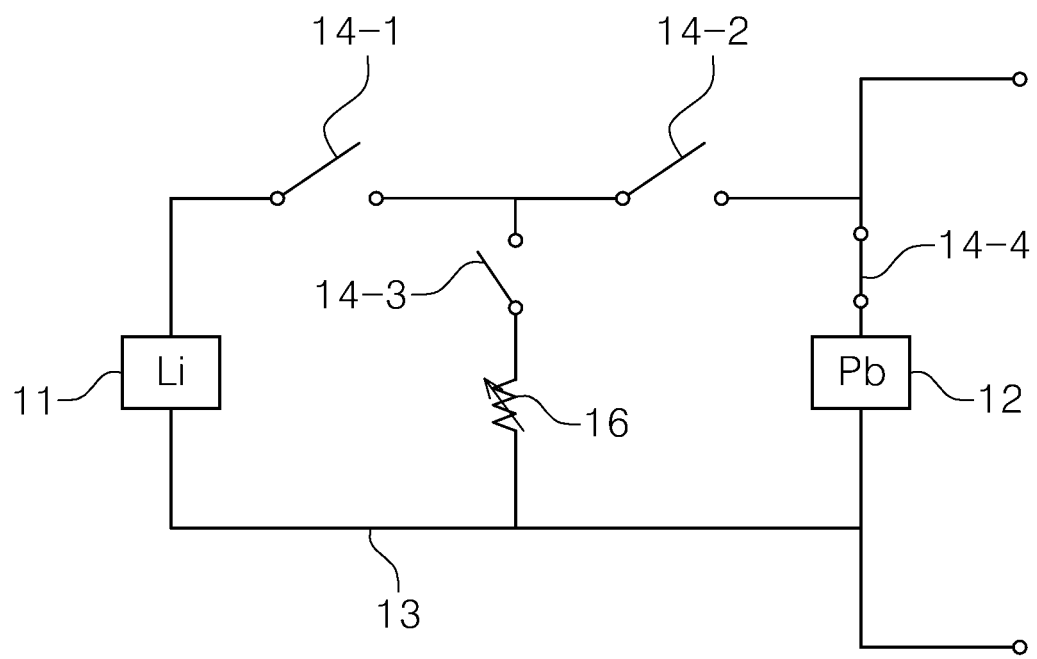
FIGS. 3 to 7 are block diagrams showing the connection states of components of the energy storage device shown in FIG. 2.

FIG. 3 is a block diagram of the energy storage device illustrated in FIG. 2. Referring to FIG. 3, the energy storage device 20 includes a first battery module, a second battery module, a current limiting circuit and a switching network 15.

The first battery module is used for assisting the second battery module when a high output is required, and has a higher discharge rate than the second battery module. For example, the first battery module may be a lithium battery module 11, and the second battery module may be a lead battery module 12. A variable resistor 16 may be used as the current limiting circuit.

The energy storage device 20 is connected to both ends of a load and serves to supply electric power to the motor 1 as a load. The switching network 15 includes a conducting wire 13 configured to connect the lithium battery module 11, the lead battery module 12 and the variable resistor 16 in parallel to each other, and a plurality of switches 14-1 to 14-4 installed on the conducting wire 13 to selectively connect or disconnect the conducting wire 13.

The lithium battery module 11 includes a plurality of lithium battery cells (not shown) connected in series or parallel. The performance of a battery may be expressed in terms of the amount of collectable electric energy (unit: kWh) and a discharge rate (C-rate) indicating how many times the capacity of the battery can be discharged in one hour. As compared with the lead battery, the lithium battery can store more electric energy per unit weight and has a faster charging/discharging speed. However, the lithium battery has a problem in that the characteristics thereof deteriorate along with the increase in the temperature of the lithium battery, the risk of explosion exists, and the price thereof is very high. In the present invention, the lithium battery is a secondary battery using metallic lithium as a negative electrode, and includes a lithium polymer battery, a lithium manganese battery, a lithium iron battery, a lithium ion battery, a lithium air battery and the like. In addition, a lithium secondary battery currently under development or a lithium secondary battery to be developed in the future may also be used.

The lead battery module 12 includes a plurality of lead battery cells (not shown) connected in series or parallel. The lead battery has a small amount of electric energy that can be collected and a small amount of electric power that can be discharged per unit time. However, the lead battery has an advantage that it is an inexpensive safe battery having no risk of explosion. The lead battery has a characteristic that the output voltage is dropped when used for a long period of time, and is recovered again after a certain period of time. Since the discharge rate of the lead battery is slow, the lead battery is limited in use as a battery for an electric vehicle. In addition, there is a problem in that the lead battery is difficult to use for charging electric energy by regenerative braking because the charging speed thereof is also slow.

As described above, the lithium battery module 11 deteriorates as the temperature increases. Therefore, the lithium battery module 11 cannot be used for a long time without a cooling device. The lead battery module 12 cannot be used for a long time due to a decrease in the output voltage, and has a problem in that the charging/discharging speed is slow. In the present embodiment, such problems are improved by connecting the lithium battery module 11 to the lead battery module 12 in parallel using the switching network 15 only when necessary.

For example, when high power is required as in the case of rapid acceleration or hill climbing, the lithium battery module 11 is connected in parallel to the lead battery module 12. When high power is not required as in the case of constant speed traveling, only the lead battery module 12 may be connected to the load.

When high output is required, if the lithium battery module 11 is directly connected to the lead battery module 12 and the load in parallel in a state in which the lead battery module 12 connected to the load, an electric current flows to the load. When the potential difference between the lead battery module 12 and the lithium battery module 11 is not large and the amount of electric current flowing through the system is not large, the lithium battery module 11 may be directly connected to the lead battery module 12 in parallel.

Figure 4:
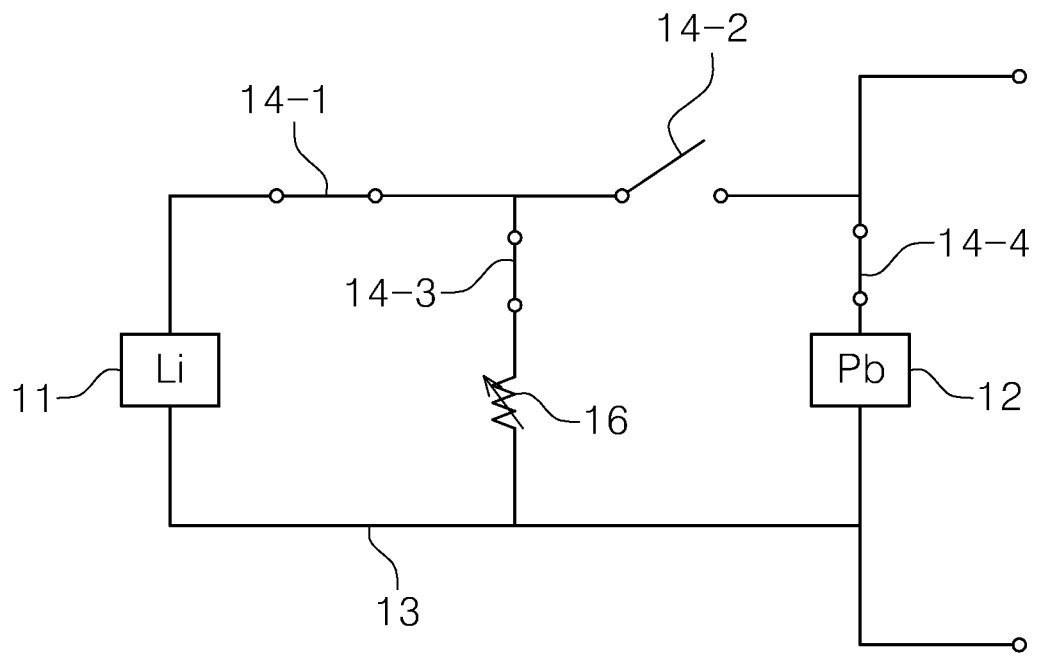
Figure 5:
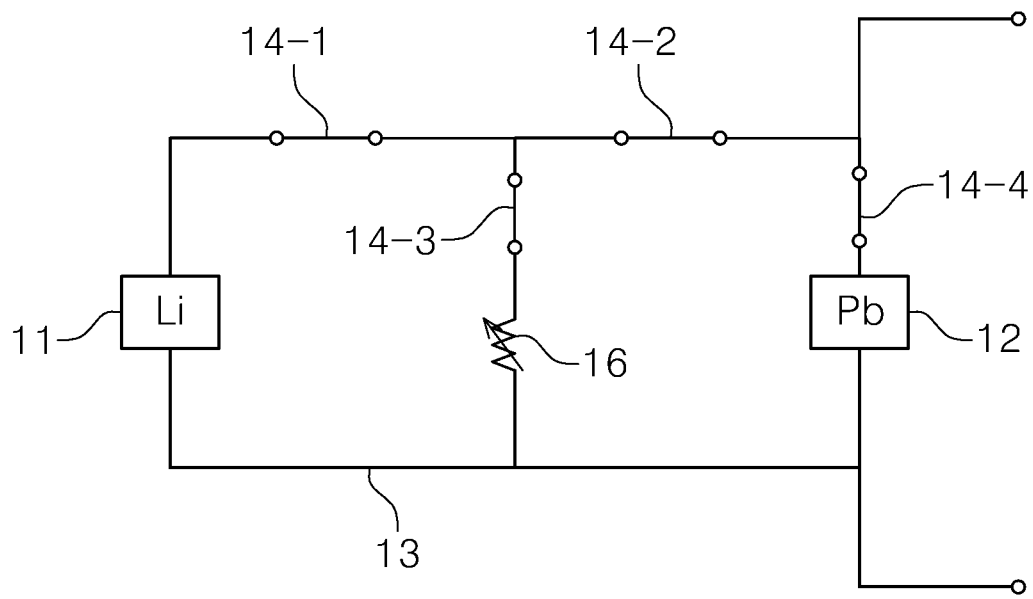
Figure 6:
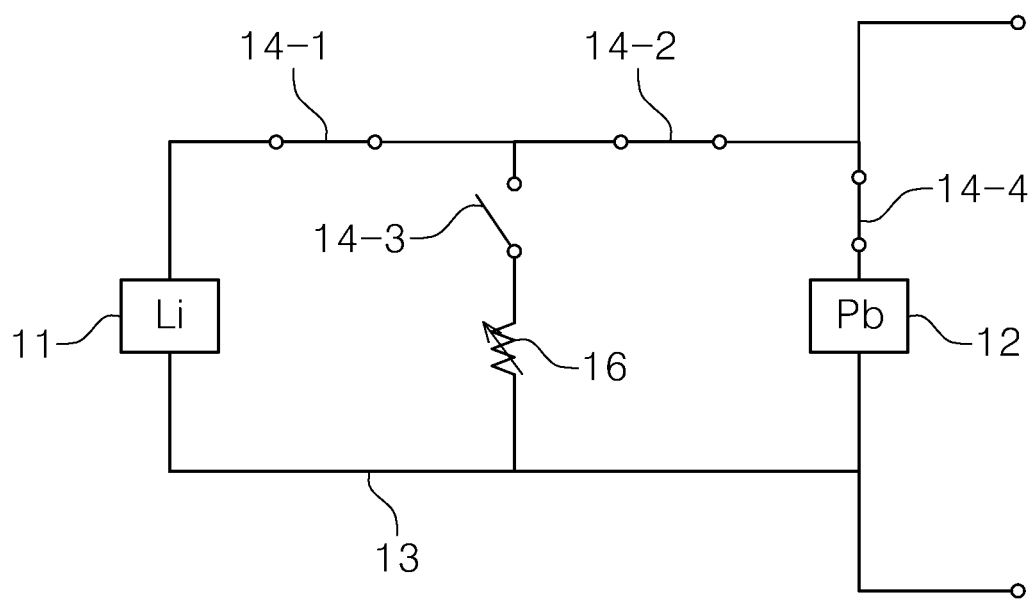

However, if there is a possibility that the lead battery module 12 or the lithium battery module 11 may be damaged due to the inrush current flowing to the module whichever has a low potential, it is desirable to have a balance between the lead battery module 12 and the lithium battery module 11. For example, when the potential of the lithium battery module 11 is high, as shown in FIG. 4, the lithium battery module 11 is first connected to the variable resistor 16 in parallel by turning off the second switch 14-2 and turning on the first switch 14-1, the third switch 14-3 and the fourth switch 14-4. In this state, the lead battery module 12 and the lithium battery module 11 are allowed to stand for a while until there is a balance. At this time, the resistance value of the variable resistor 16 may be appropriately selected according to the state of the lithium battery module 11. The resistance value may be increased initially and then gradually decreased. Then, as shown in FIG. 5, by turning on the second switch 14-2, the lead battery module 12 and the lithium battery module 11 are connected in parallel. After a while, as shown in FIG. 6, the third switch 14-3 is turned off.

Figure 7:
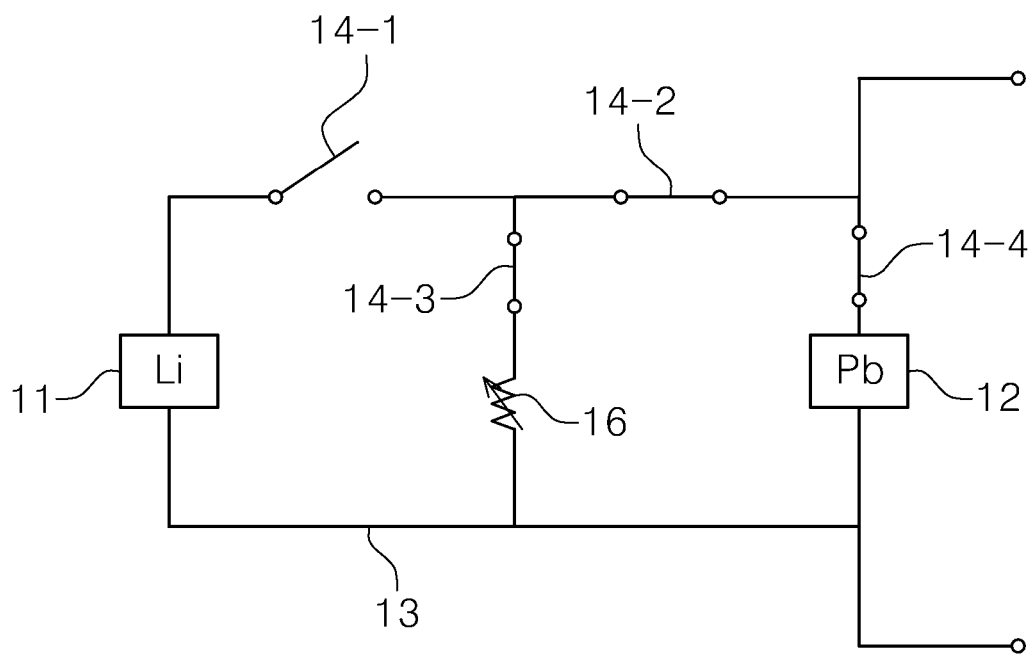

Conversely, when the potential of the lead battery module 12 is high, as shown in FIG. 7, the lithium battery module 12 is first connected to the variable resistor 16 in parallel by turning off the first switch 14-1 and turning on the second switch 14-2, the third switch 14-3 and the fourth switch 14-4. When the balance between the lead battery module 12 and the lithium battery module 11 is achieved by maintaining this state for a while, as shown in FIG. 5, the lead battery module 12 and the lithium battery module 11 are connected in parallel by turning on the first switch 14-1. After a while, as shown in FIG. 6, the third switch 14-3 is turned off.

Whether the balance between the lead battery module 12 and the lithium battery module 11 is achieved may be determined according to the values measured by the first detection unit 21 and the second detection unit 22, and whether the lithium battery module 11 needs to be connected may be determined according to the output required by the motor 1.

The first detection unit 21 is connected to the lithium battery cells of the lithium battery module 11 to measure a temperature and voltage of each cell and a current flowing through the output terminal of the lithium battery module 11. The first detection unit 21 is connected in series by one communication line, and may transmit information such as the temperature and voltage of each cell to the controller 15 in a serial communication manner.

The second detection unit 22 is connected to the lead battery cells of the lead battery module 12 to measure a temperature and voltage of each cell and a current flowing through the output terminal of the lead battery module 12, and may then transmit information such as the temperature and voltage of each cell to the controller 15.

The controller 30 monitors the state of the lithium battery module 11 and the lead battery module 12 of the energy storage device 20 and manages the energy storage device 20 so that it can be maintained and used under optimal conditions.

Figure 8:
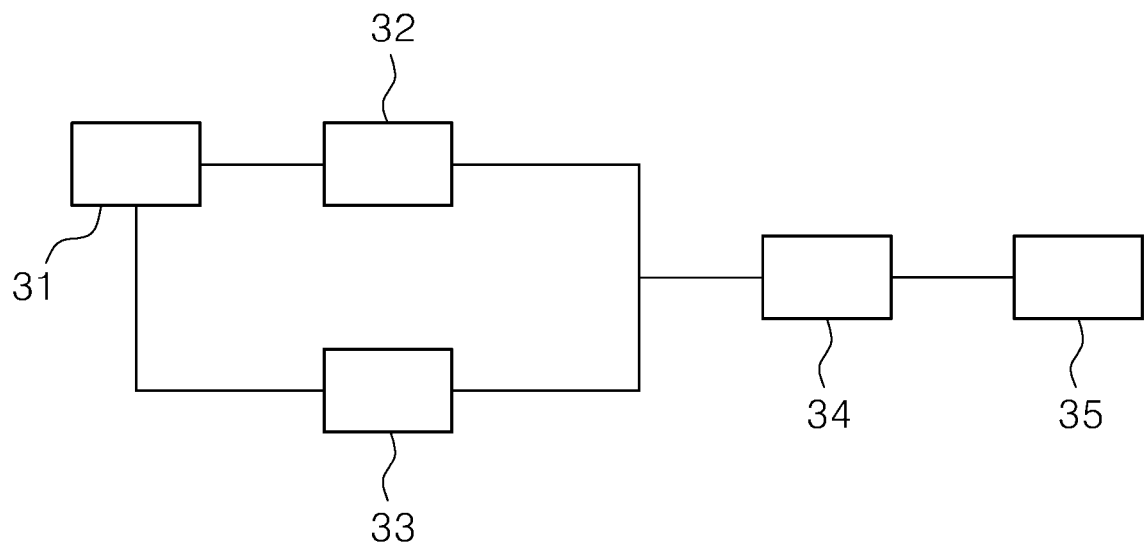
FIG. 8 is a block diagram of the controller shown in FIG. 2.

As shown in FIG. 8, the controller 30 includes a receiving unit 31, a measurement unit 32, a comparison unit 33, a signal generation unit 34 and a transmitting unit 35. Based on the information received from the first detection unit 21 and the second detection unit 22, the controller 30 monitors the temperature and voltage of each cell of the lithium battery module 11 and the lead battery module 12, the current at the output terminal of each of the lithium battery module 11 and the lead battery module 12, and the like. In addition, the controller 30 transmits a control signal generated based on the state of each cell and the information inputted through the motor controller 2 to the switching network 15 to change the connection state of the lithium battery module 11, the lead battery module 12 and the variable resistor 16, thereby comprehensively managing the energy storage device 20.

The receiving unit 31 receives data such as the temperature, the voltage and the current measured by the first detection unit 21 and the second detection unit 22. In addition, the receiving unit 31 receives power data required for driving the motor 1 through the motor controller 2.

The measurement unit 32 measures the state of charge (SOC) of each of the lithium battery module 11 and the lead battery module 12 by a coulomb count method using the data received from the receiving unit 31, and determines the state of health (SOH). Furthermore, the measurement unit 32 estimates the power that can be outputted to the load. In addition, the measurement unit 32 calculates the rate of change of the current.

The comparison unit 33 inspects whether the lithium battery cells are in a safe state by comparing the temperature of the lithium battery cells with a predetermined reference temperature through the use of the data received from the receiving unit 31. Furthermore, the comparison unit 33 inspects whether the lead battery cells are in a usable state by comparing the voltage of the lead battery cells with a predetermined reference voltage. In addition, the comparison unit 33 determines whether or not it is time to connect the lithium battery module 11 to the lead battery module 12 by comparing the current value and the current change rate of the lead battery module 12 with predetermined values. That is, it is determined whether a discharge exceeding the discharge rate of the lead battery module 12 is required because the current value and the current change rate of the lead battery module 12 are equal to or larger than predetermined values.

The signal generation unit 34 generates a control signal for determining the connection state of the lithium battery module 11, the lead battery module 12 and the variable resistor 16 in consideration of the charging rates of the lithium battery module 11 and the lead battery module 12, the temperature of the lithium battery module 11, the voltage of the lead battery module 12, the driving state received through the motor controller 2, the current value and current change rate of the lead battery module 12, and the like. The signal generation unit 34 transmits the control signal to the energy storage device 20.

For example, if the lithium battery module 11 and the lead battery module 12 are sufficiently charged and if a high output is not particularly required because an electric vehicle is traveling at a constant speed, only the lead battery module 12 may be used.

In addition, if the temperature of the lithium battery module 11 rises above the reference temperature by continuously using the lithium battery module 11 together, the signal generation unit 34 generates a control signal for changing the connection state so as to use only the lead battery module 12, and transmits the control signal to the energy storage device 20.

Since the controller 30 is connected to the motor control unit of the motor controller 2, it is possible for the controller 30 to check the driving state such as restarting after stoppage or traveling on a hill. Hereinafter, the change in the connection state according to the traveling state will be described. The controller changes the connection state in response to the request according to the traveling state. If it is difficult to change the connection state in response to the driving state when considering the states of the lithium battery module 11 and the lead battery module 12, prior to changing the connection state according to the traveling state, the controller may change the connection state in such a direction as to protect the lithium battery module 11 and the lead battery module 12.

If a large output is required depending on the traveling state, the controller generates a control signal for switching the connection state to a state in which the lithium battery module 11 is connected, and transmits the control signal to the energy storage device 20. This is because the lead battery module 12 has low power that can be extracted and used even when it is sufficiently charged.

The traveling state may also be determined through the current value and current change rate of the lead battery module 12. That is, when it is determined that a discharge exceeding the discharge rate of the lead battery module 12 is required because the current value and current change rate of the lead battery module 12 are equal to or larger than the predetermined values, the controller generates a control signal so that the lithium battery module 11 is connected to the load.

In this case, the lithium battery module 11 may be directly connected to the lead battery module 12. However, in the case of direct connection, the output of the energy storage device 20 may be rapidly changed, which may result in an impact. Therefore, it is preferable that the lithium battery module 11 is first connected to the variable resistor 16, and then the lithium battery module 11 is connected to the lead battery module 12 in a state in which the lithium battery module 11 achieves a balance with the lead battery module 12. After a while, the variable resistor 16 is removed.

Figure 9:
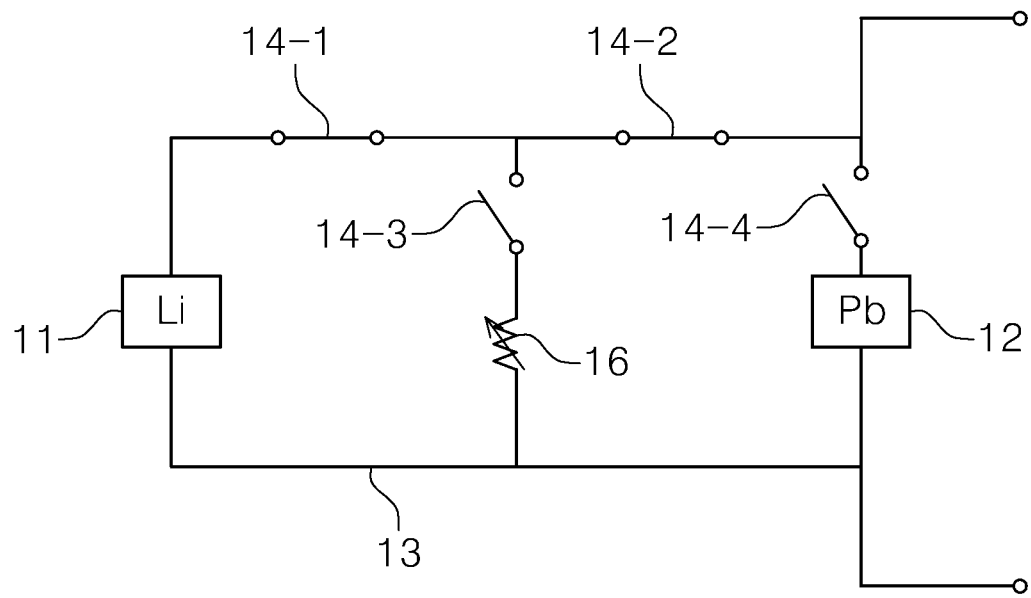
FIG. 9 is a block diagram showing a connection state of components for regenerative braking of the energy storage device shown in FIG. 2.

When the charging according to the regenerative braking is required, as shown in FIG. 9, the lithium battery module 11 is connected to the regenerative braking system 7 by turning on the first switch 14-1 and the second switch 14-2 and turning off the third switch 14-3 and the fourth switch 14-4. Since the lead battery module 12 is hardly charged by regenerative braking, it is necessary to separate the lithium battery module 11 from the lead battery module 12 and connect the lithium battery module 11 to the regenerative braking system 7 during regenerative braking. This provides an advantage that the charging efficiency can be improved during regenerative braking.

In addition, when the charging of the lithium battery module 11 is completed, the lead battery module 12 may be charged by charging the lead battery module 12 through the charged lithium battery module 11. As described above, the lead battery module 12 is hardly charged by regenerative braking. In this case, the controller 30 transmits a control signal to the switching network 15 to switch the connection state of the switching network 15 so that the charged lithium battery module 11 and the lead battery module 12 are connected to each other.

Figure 10:
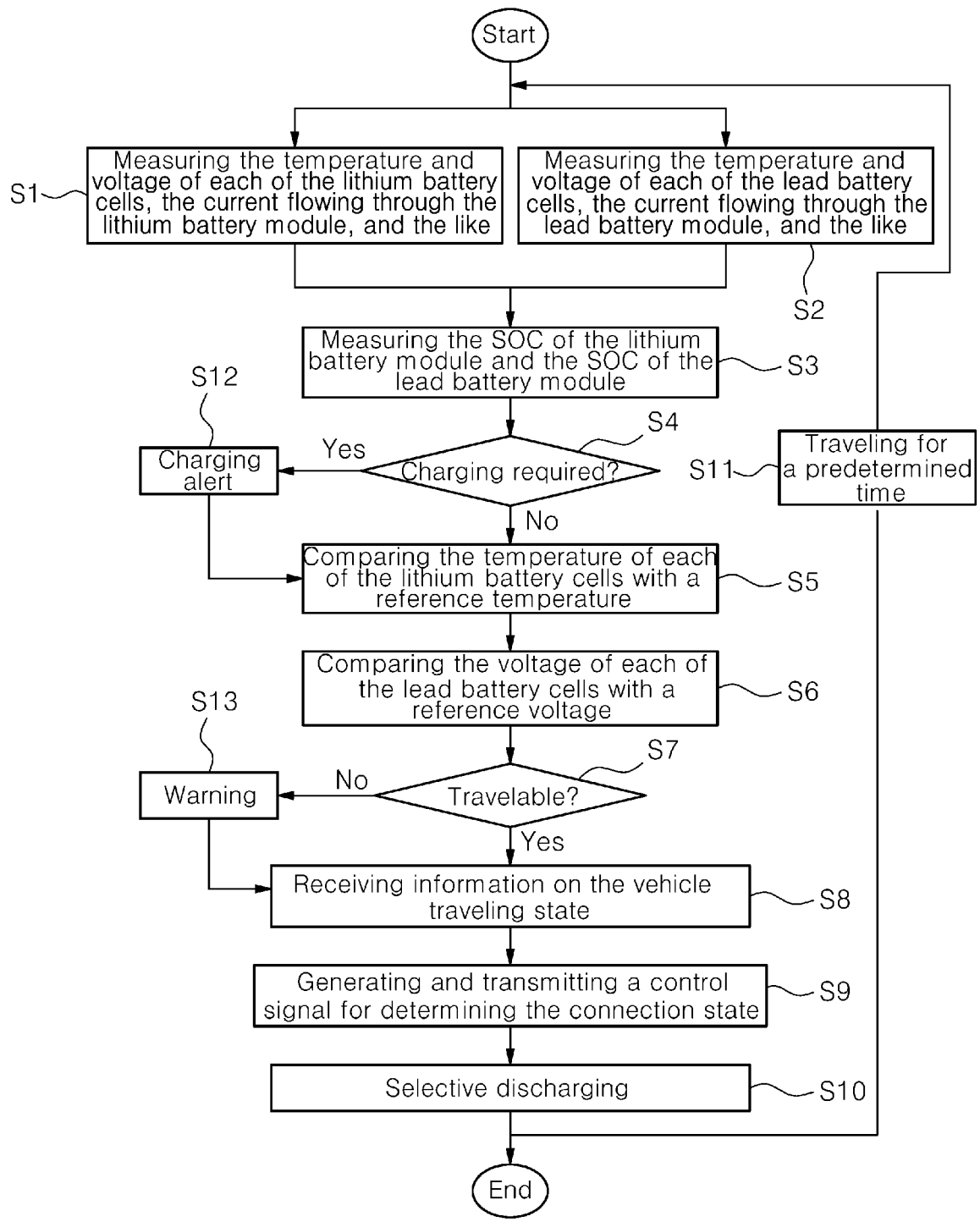
FIG. 10 is a flowchart showing the operation of the hybrid energy storage module system according to an embodiment of the present invention.

Hereinafter, the operation of the hybrid energy storage module system described above will be described with reference to FIG. 10.

When the vehicle starts to travel, the first detection unit 21 and the second detection unit 22 measure the temperature and voltage of each cell of the lithium battery module 11 and the lead battery module 12 and the current at the output terminal of each of the lithium battery module 11 and the lead battery module 12 (S1 and S2)

Next, the measurement unit 32 of the controller 30 measures the state of charge, the state of health and the like by using the data measured by the first detection unit 21 and the second detection unit 22 (S3). It is determined whether traveling is possible through the measurement result of the state of charge (S4). When the result of measurement indicates that traveling is possible, the measured state of charge is transmitted to the driver through a display installed at the driver's seat of an electric vehicle. If charging is required because both the lithium battery module 11 and the lead battery module 12 have a low state of charge, the necessity of charging is notified to the driver through the display installed in the driver's seat of an electric vehicle (S12).

Next, the comparison unit 33 of the controller 30 compares the temperature value of each cell of the lithium battery module 11 measured by the first detection unit 21 with a reference temperature (S5). In addition, the comparison unit 33 compares the voltage value of each cell of the lead battery module 12 measured by the first detection unit 22 with a reference voltage (S6). When the result of comparison indicates that traveling is difficult because the temperature value of each cell of the lithium battery module 11 is equal to or higher than the reference temperature and the voltage value of each cell of the lead battery module 12 is equal to or lower than the reference voltage, a warning is given to the driver through the display installed at the driver's seat of the electric vehicle so that the driver can cope with the situation (S13). In addition, if necessary, the controller 30 stops the operation of the electric vehicle.

Next, the controller 30 receives the information on the traveling state of the electric vehicle through the motor control unit of the motor controller 2 or the current value and current change rate of the lead battery module 12 (S8). For example, if the current value and current change rate of the lead battery module 12 are equal to or larger than a predetermined value, it may be determined that the electric vehicle restarts after stoppage or travels on a hill. Otherwise, it may be determined that the electric vehicle travels at a constant speed.

All of steps S4 to S8 are performed in the controller 30, and may be performed simultaneously or in a different order from the above-described order.

Next, the signal generation unit 34 of the controller 30 determines the connection state based on the results obtained in steps S4 to S8, generates a control signal, and transmits the control signal to the energy storage device 20 (S9).

Next, the energy storage device 20 arranges the lithium battery module 11, the lead battery module 12 and the variable resistor 16 according to the control signal and then discharges electricity (S10).

After a certain period of time (S11), steps S1 to S10 are repeated again.

Figure 11:
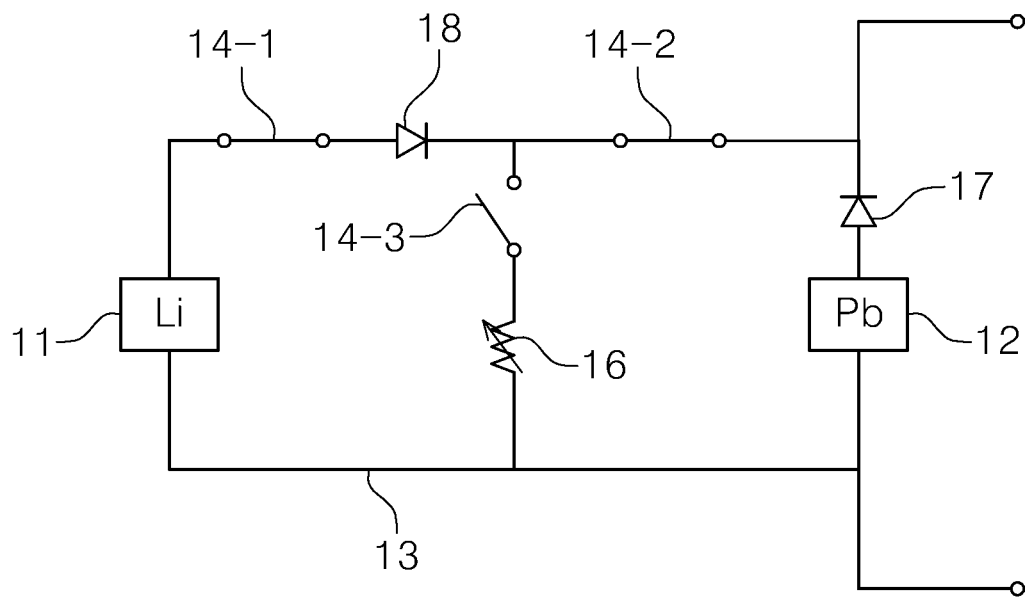
FIG. 11 is a block diagram of a hybrid energy storage module system according to another embodiment of the present invention.

FIG. 11 is a block diagram of a hybrid energy storage module system according to another embodiment of the present invention. As shown in FIG. 11, the hybrid energy storage module system may further include a first diode 17 and a second diode 18.

The first diode 17 and the second diode 18 are safety devices for preventing an inrush current from flowing from the lead battery module 12 to the lithium battery module 11 or vice versa. As described above, if the lithium battery module 11 is connected in a state in which a balance is achieved between the lead battery module 12 and the lithium battery module 11, it is less likely that the inrush current flows. The first diode 17 and the second diode 18 may be installed just in a case. The second diode 18 prevents a current from flowing from the lead battery module 12 to the lithium battery module 11 rather than the load, and the first diode 17 prevents a current from flowing from the lithium battery module 11 to the lead battery module 12 so that the current flows only to the load.

In the case of the present embodiment, a separate switching device capable of changing the directions of the first diode 17 and the second diode 18 may be required for regenerative braking.

While the preferred embodiments of the present invention have been shown and described above, the present invention is not limited to the specific embodiments described above. It will be apparent to those skilled in the art that various modifications may be made without departing from the spirit of the present invention recited in the claims. These modifications should not be understood separately from the technical idea or perspective of the present invention.

For example, although it has been described that the variable resistor 16 is used as the current limiting circuit, a general resistor may be used. In addition, a current limiting circuit in which resistance is changed may be configured by selectively connecting a plurality of resistors in series or parallel. In addition, the current limiting circuit may be configured by selecting one of a plurality of resistors having different resistance values.

What is claimed is:

1. A hybrid energy storage module system for supplying electric power required to drive a load, comprising:
   an energy storage device including a second battery module, a first battery module having a higher discharge rate than the second battery module and a switching network configured to connect the first battery module to the second battery module in parallel or disconnect the first battery module from the second battery module, the energy storage device connected to the load and configured to supply electric power to the load;
   a first detection unit configured to measure data representing a state of the first battery module;
   a second detection unit configured to measure data representing a state of the second battery module; and
   a controller configured to receive data from the first detection unit and the second detection unit, generate a control signal for controlling the switching network, and transmit the control signal to the switching network,
   wherein the controller is configured to generate a control signal for controlling the switching network so that the second battery module is connected to the load before the first battery module is connected to the second battery module,
   the controller is configured to generate a control signal for controlling the switching network based on data received from the first detection unit and the second detection unit so that the first battery module is selectively connected to or disconnected from the second battery module, and
   the switching network includes at least one switch installed in a network that connects the second battery module and the first battery module in parallel with each other.

2. The system according to claim 1, wherein the energy storage device further includes a current limiting circuit,
   the switching network is configured to selectively connect or disconnect the current limiting circuit to or from the first battery module or the second battery module, and
   the controller is configured to generate a control signal for controlling the switching network based on data received from the first detection unit and the second detection unit so as to connect the first battery module or the second battery module to the current limiting circuit before connecting the second battery module to the first battery module.

3. The system according to claim 2, wherein the switching network includes switches installed in a network that connects the second battery module, the first battery module and the current limiting circuit in parallel with each other.

4. The system according to claim 2, wherein the current limiting circuit is a variable resistor.

5. The system according to claim 1, wherein the controller is configured to generate a control signal for controlling the switching network so that the second battery module is disconnected from the load after the first battery module is disconnected from the second battery module.

6. The system according to claim 1, wherein the controller is configured to generate a control signal for controlling the switching network so that the first battery module is charged after the first battery module is disconnected from the second battery module when charging is performed by regenerative braking.

7. The system according to claim 1, wherein the controller is configured to generate a control signal for controlling the switching network so that the first battery module is connected to the second battery module when the magnitude and slope of a current flowing through an output terminal of the second battery module, which are received from the second detection unit, are equal to or larger than a predetermined value.

8. The system according to claim 1, wherein the switching network is provided with a first diode configured to prevent a current from flowing from the first battery module to the second battery module and a second diode configured to prevent a current from flowing from the second battery module to the first battery module.

9. The system according to claim 1, wherein the first battery module is a lithium battery module.

10. The system according to claim 9, wherein the lithium battery module is selected from a lithium polymer battery, a lithium manganese battery, a lithium iron battery, a lithium ion battery and a lithium air battery.

11. The system according to claim 1, wherein the second battery module is a lead battery module.

* * * * *